United States Patent
Huo et al.

(10) Patent No.: US 10,121,890 B2
(45) Date of Patent: **\*Nov. 6, 2018**

(54) HIGH VOLTAGE TRANSISTOR STRUCTURE

(71) Applicant: Taiwan Semiconductor Manufacturing Company, Ltd., Hsin-Chu (TW)

(72) Inventors: Ker Hsiao Huo, Zhubei (TW); Chih-Chang Cheng, Hsinchu (TW); Ru-Yi Su, Kouhu Township (TW); Jen-Hao Yeh, Kaohsiung (TW); Fu-Chih Yang, Fengshan (TW); Chun Lin Tsai, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/018,605

(22) Filed: Feb. 8, 2016

(65) Prior Publication Data

US 2016/0155841 A1    Jun. 2, 2016

Related U.S. Application Data

(60) Continuation of application No. 14/533,822, filed on Nov. 5, 2014, now Pat. No. 9,257,533, which is a (Continued)

(51) Int. Cl.
*H01L 29/66* (2006.01)
*H01L 29/10* (2006.01)
(Continued)

(52) U.S. Cl.
CPC ........ *H01L 29/7816* (2013.01); *H01L 21/265* (2013.01); *H01L 29/0646* (2013.01);
(Continued)

(58) Field of Classification Search
USPC .................................................. 257/335-346
See application file for complete search history.

(56) References Cited

U.S. PATENT DOCUMENTS

| 6,144,538 | A | 11/2000 | Chao |
| 6,420,771 | B2 * | 7/2002 | Gregory ................ H01L 21/761 257/506 |

(Continued)

FOREIGN PATENT DOCUMENTS

KR    10-2010-0077474    10/2010

OTHER PUBLICATIONS

Bertrand, I., et al., "New Lateral DMOS and IGBT Structures Realized on a Partial SOI Substrate Based on LEGO Process", IEEE BCTM 5.2, 2005, pp. 74-77.
(Continued)

*Primary Examiner* — Nishath Yasmeen
(74) *Attorney, Agent, or Firm* — Haynes and Boone, LLP

(57) ABSTRACT

An embodiment of a structure provides an enhanced performing high voltage device, configured as a lateral diffused MOS (HV LDMOS) formed in a tri-well structure (a small n-well in an extended p-type well inside an n-type well) within the substrate with an anti-punch through layer and a buried layer below the n-type well, which reduces substrate leakage current to almost zero. The drain region is separated into two regions, one within the small n-well and one contacting the outer n-type well such that the substrate is available for electric potential lines during when a high drain voltage is applied.

20 Claims, 13 Drawing Sheets

Related U.S. Application Data division of application No. 13/673,734, filed on Nov. 9, 2012, now Pat. No. 8,969,913.

(60) Provisional application No. 61/579,794, filed on Dec. 23, 2011.

(51) Int. Cl.

| | |
|---|---|
| *H01L 21/26* | (2006.01) |
| *H01L 29/78* | (2006.01) |
| *H01L 29/739* | (2006.01) |
| *H01L 29/06* | (2006.01) |
| *H01L 21/265* | (2006.01) |

(52) U.S. Cl.
CPC ...... *H01L 29/0696* (2013.01); *H01L 29/1033* (2013.01); *H01L 29/1083* (2013.01); *H01L 29/1095* (2013.01); *H01L 29/66325* (2013.01); *H01L 29/66681* (2013.01); *H01L 29/7393* (2013.01)

(56) References Cited

U.S. PATENT DOCUMENTS

| | | | |
|---|---|---|---|
| 7,122,876 B2 | 10/2006 | Wu et al. | |
| 7,521,342 B2 | 4/2009 | Wu et al. | |
| 7,790,589 B2 | 9/2010 | Eggenkamp et al. | |
| 8,686,498 B2 | 4/2014 | Lee | |
| 8,969,913 B2 * | 3/2015 | Huo | H01L 29/66325 257/141 |
| 2005/0253218 A1 * | 11/2005 | Jeon | H01L 27/0629 257/500 |
| 2009/0020811 A1 * | 1/2009 | Voldman | H01L 29/0619 257/337 |
| 2011/0241114 A1 | 10/2011 | Su et al. | |

OTHER PUBLICATIONS

Hardikar, Shyam, et al., "Transient Substrate Currents in Junction-Isolated Lateral IBGT", IEEE Transactions on Electron Devices, vol. 53, No. 6, Jun. 2006, pp. 1487-1490.

\* cited by examiner

HIGH VOLTAGE TRANSISTOR STRUCTURE

PRIORITY CLAIM

The present application is a Continuation application of U.S. application Ser. No. 14/533,822, filed Nov. 5, 2014, now issued as U.S. Pat. No. 9,257,533, which is a Divisional U.S. application Ser. No. 13/673,734, filed Nov. 9, 2012, now issued as U.S. Pat. No. 8,969,913, which claims the priority to U.S. Provisional Application No. 61/579,794, filed Dec. 23, 2011, the disclosures of all of which are incorporated herein by reference in their entireties.

FIELD

The present disclosure relates generally to semiconductor technology, and more particularly, to high voltage semiconductor devices and methods of making the same.

BACKGROUND

Technological advances in semiconductor integrated circuit (IC) materials, design, processing, and manufacturing have enabled ever-shrinking IC devices, where each generation has smaller and more complex circuits than the previous generation.

As semiconductor circuits composed of devices such as metal-oxide-semiconductor field effect transistors (MOSFETs) are adapted for high voltage applications, such as high voltage lateral diffusion metal-oxide-semiconductor devices (HV LDMOSs) including high voltage insulated gate bipolar transistors (HV IGBTs), problems arise with respect to decreasing voltage performance as the scaling continues with advanced technologies. To prevent punch-through between source and drain, or to reduce resistance of source and drain, standard MOS fabrication process flows may be accompanied by multiple implantations of high concentrations. Substantial substrate leakage and voltage breakdown often occur with device reliability degradation.

Performance of a HV MOS transistor is often limited by its substrate leakage and breakdown voltage (BV) threshold. Substantial substrate leakage reduces switching speed and increases likelihood of unwanted parasitic bipolar junction (BJT) turn-on and latch-up. While various methods including use of full or partial silicon-on-insulator (SOI) substrates has been developed to reduce substrate leakage, a HV LDMOS device having a low substrate leakage and a high breakdown voltage threshold and a method for making the same in a cost effective manner continues to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

Figure 1A:
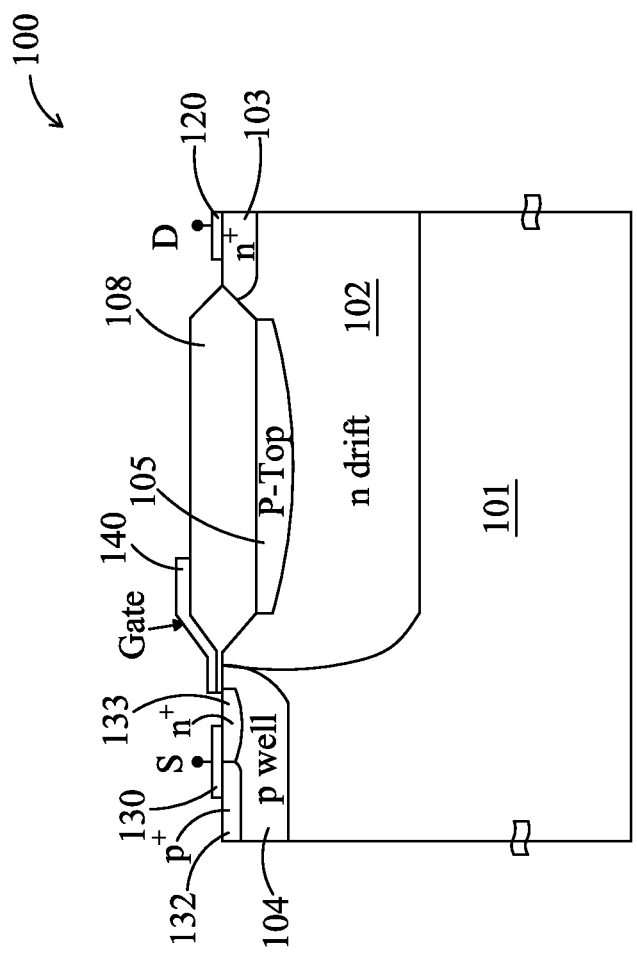
FIGS. 1A and 1B are cross-sectional views of two types of conventional high voltage lateral diffusion metal oxide semiconductor (HV LDMOS) transistor devices.

Various embodiments of the present invention will be explained in detail with reference to the accompanying drawings.

DETAILED DESCRIPTION

The present disclosure relates to semiconductor high voltage lateral diffusion metal oxide semiconductor (HV LDMOS) transistors having low substrate leakage and high breakdown voltage thresholds and a method for fabricating such devices. It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Spatially relative terms, such as "beneath," "below," "lower," "above," "upper", "over" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

FIG. 1A is a cross-sectional view of a conventional HV LDMOS transistor. In FIG. 1A, an n-type HV MOS device 100 is fabricated in a p-substrate 101. A deep n-well (n-drift) 102 is formed in the substrate 101. A field oxide 108 is formed over the n-well 102 and a gate 140 is partly overlying the field oxide 108. A source and a drain are formed on opposite sides of the gate 140. The source includes a pair of oppositely doped regions p+ (132) and n+ (133) contained in a p-well 104. Source terminal 130 is electrically connected to the source regions 132 and 133. On one side of gate 140 and at the edge of field oxide 108, n+ doped drain region 120 is formed in n-well 102 and electrically connected to a drain terminal 120. A p-top region 105 is formed between field oxide 108 and the deep implanted n-drift region 102. The p-top region 105 is a floating layer and is not connected to the source or the drain region.

Figure 1B:
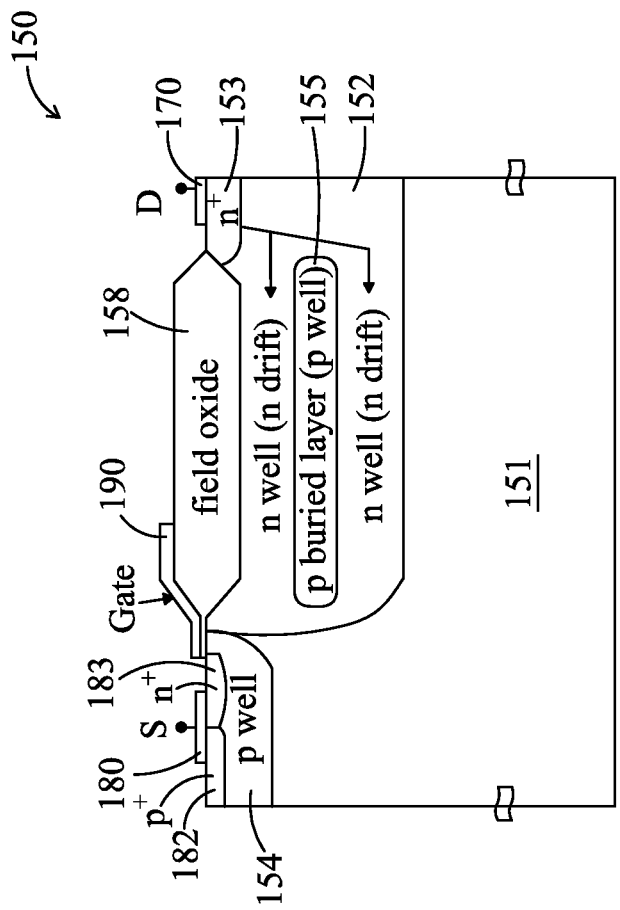

FIG. 1B is a cross-sectional view of another conventional HV LDMOS device 150. Unlike device 100 in FIG. 1A, device 150 has the p-top layer replaced by a buried p-well 155. In FIG. 1B, an n-type HV LDMOS device 150 is fabricated in a p-substrate 151. A deep n-well (n-drift) 152 is formed in the substrate 151. A field oxide 158 is formed on the n-well 152 and a gate 190 is partly overlying the field oxide 158. A source and a drain are formed on either side of the gate 190. The source includes a p-type region p+ (182) and an n-type region N+ (183), both contained in a p-well 154. Source terminal 180 is electrically connected to source regions 182 and 183. On the opposite side of gate 190 and at the edge of field oxide 158, n+ doped drain region 153 is formed in n-well 152 and is electrically connected to a drain terminal 170. A deep implanted region p-well 155 is formed in the middle of the deep implanted n-drift region 152 and is also under but not connected to field oxide 158. The buried p-well region 155 is a floating layer and is not connected to the source or the drain region.

The present disclosure discloses a HV LDMOS transistor, particularly an insulated gate bipolar transistor (IGBT) that has improved substrate leakage and breakdown voltage than the transistors of FIGS. 1A and 1B. Substrate leakage during device operation can trigger a parasitic bipolar junction transistor (BJT) turn-on and lead to device latch-up and/or burn out. A latch-up circuit is a type of short circuit with a low-impedance path between parasitic structures. The parasitic structure is usually equivalent to a thyristor, a positive-negative-positive-negative (PNPN) structure which acts as a positive-negative-positive (PNP) and a negative-positive-negative (NPN) transistor stacked next to each other. During a latch-up when one of the transistors is conducting, the other one begins conducting too. The transistors both keep each other in saturation for as long as the structure is forward-biased and some current flows through the transistors. A latch-up circuit can cause a product to fail.

The HV LDMOS of the present disclosure uses a U-shaped second well that isolates hole current at a portion of the drain junction. The U-shaped second well effectively forms and directs hole current across the transistor by creating a low potential conduit and blocks hole carrier injection into the substrate. Because more holes flow through the low potential conduit, less current is leaked through the substrate. During high drain voltage and transistor off condition, a buried layer having a higher dopant concentration outside of the second well directs high potential through the substrate, and an anti-punch through layer below a portion of the drain structure reduces the high potential through the inner U-shape and the second well regions. The buried layer reduces the beta gain of a PNP junction that includes elements from the drain side vertically down to the substrate. Thus, the buried layer and anti-punch through layer increase the breakdown voltage for the HV LDMOS with the U-shape second well while the U-shaped second well significantly reduces hole current substrate leakage.

Figure 2A:
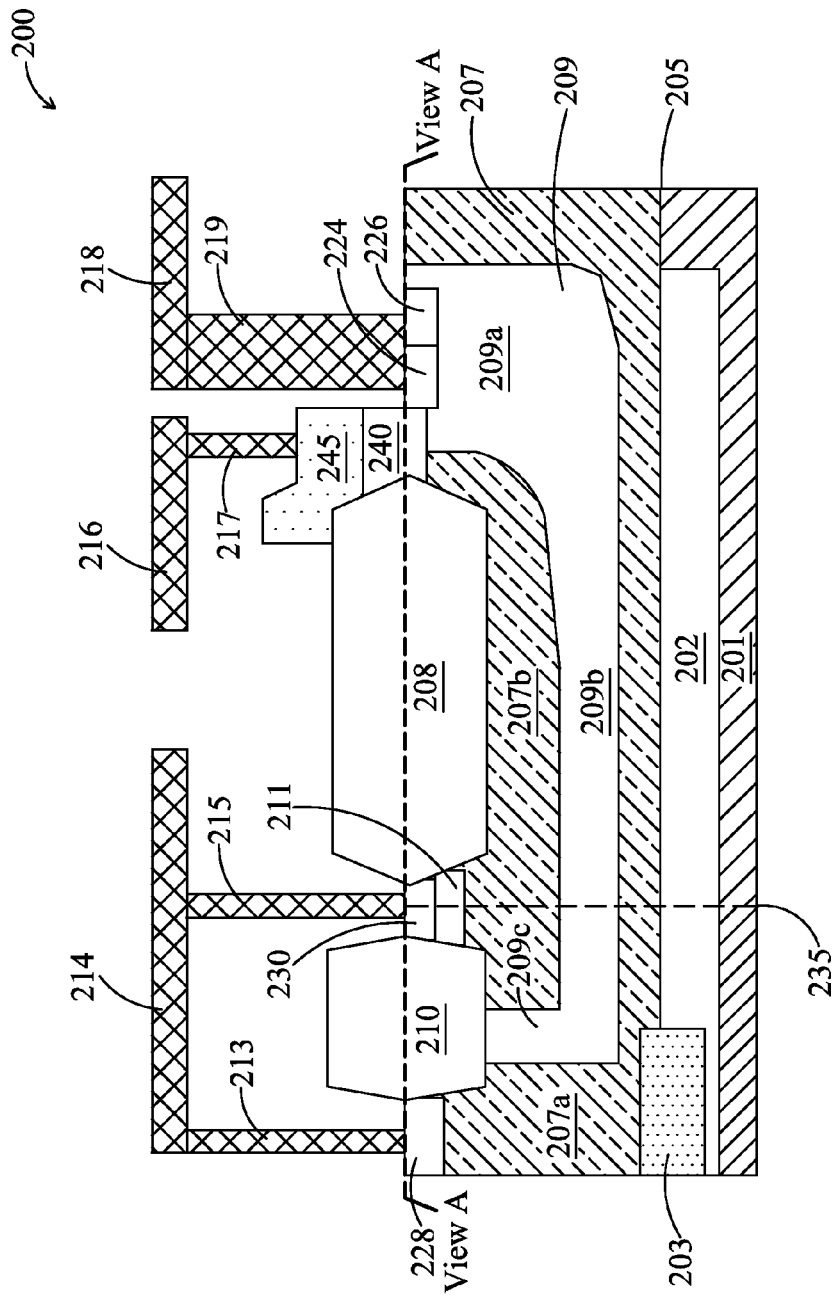
FIG. 2A is a cross-sectional view of a HV LDMOS transistor according to various embodiments of the present disclosure.

FIG. 2A shows a cross-sectional view of a HV LDMOS transistor 200 according to various embodiments of the present disclosure. The HV LDMOS of FIG. 2A is a transistor having low substrate leakage and good breakdown voltage (BV) threshold without using expensive silicon on insulator (SOI) substrates and difficult-to-implement processes. The HV LDMOS 200 may be a high voltage insulated gate bipolar transistors (HV IGBT). In FIG. 2A, a lightly doped substrate 201 having a first type of conductivity is provided. In the present embodiment, the HV LDMOS transistor 200 is an n-type HV LDMOS, and thus, the substrate 201 includes a p-type silicon substrate (p-substrate). The substrate may include a semiconductor wafer, such as a silicon wafer. Alternatively or in addition in other embodiments, the substrate includes other elementary semiconductors, such as germanium, or a compound semiconductor, such as silicon carbide, gallium arsenic, indium arsenide, and indium phosphide. The substrate may include an alloy semiconductor, such as silicon germanium, silicon germanium carbide, gallium arsenic phosphide, and gallium indium phosphide.

An implant process is used to create buried layers 202 and 203 at and below portions of a top surface 205 of the substrate 201 using a dopant that creates a second type of conductivity layer. For example, for a p-type substrate the buried layer would be n-type. The buried layers 202 and 203 have different peak dopant concentrations. The dopants may be same or different. According to various embodiments, the buried layer 203 under a portion of the drain has a higher peak dopant concentration than the buried layer 202. In some embodiments, the peak dopant concentration of buried layer 203 is about twice that of the peak dopant concentration of buried layer 202. After subsequent annealing and other processes, the buried layer 203 grows into adjacent layers as shown in FIG. 2A above the substrate top surface 205.

A first well 207 is formed over the substrate 201, the first well having a different type of conductivity from the substrate. For example, the substrate has a p-type conductivity and the first well has an n-type conductivity. In the present embodiment, the first well 207 is an N-Drift (n-well) formed over the p-substrate 201 by an epitaxial process using a dopant.

A second well 209 is formed in the first well 207, the second well 209 having the same type of conductivity as the substrate 201. The second well 209 may be referred as a P-body. The second well 209 may have different portions, each portion having a different location and depth in the first well 207 from the other portions. Two or three portions may be formed in separate doping processes. For example, shown in FIG. 2A, the second well P-Body 209 has three portions: a portion 209a, which surrounds source regions 224 and 226, a portion 209b, which extends out from the portion 209a in a direction towards the drain structure 228 and 230, and a portion 209c between different parts of the drain structure. The three portions of the P-Body are attached to each other forming a U-shape. The ends of the U-shape are portions 209a and 209c. The bottom of the U-shape is portion 209b. The second well 209 separates the first well 207 into two portions 207a and 207b. The first well portion 207b is surrounded by the second well 209 and the first well portion 207a surrounds the second well 209.

The N-Drift may have an n-type dopant such as phosphorus, and the P-Body may have a p-type dopant such as boron. In one embodiment, the N-Drift and P-Body may be formed by a plurality of processing steps, whether now known or to be developed, such as growing a sacrificial oxide on the substrate, opening a pattern for the location(s) of the P-Body regions or N-Drift region, and implanting the impurities. The three portions may be formed in three separately performed implantations using two or three masks. The three portions may also be formed in two separately performed implantation using two masks, where portions 290a and 290c are implanted together with one or more implantation steps. In one embodiment, the three portions each have a different dopant concentration profile and different peak dopant concentrations.

Two field insulating layers 208 and 210 separate the gate and the drain structures. The field insulating layer 208 separates the gate structure from the drain structure. The field insulating layer 210 separates different portions 228 and 230 of the drain structure and is disposed over the third portion 209c of the second well 209. A gate structure 245 and 240 has a first portion overlying the first well N-Drift 207b and a second portion overlying the second well P-Body 209 (209a). The gate structure includes a gate dielectric 240 and a gate electrode 245 formed on the gate dielectric 240. The gate dielectric 240 may include a silicon oxide layer suitable for high voltage applications. Alternatively, the gate dielectric 240 may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, hafnium oxide, or combinations thereof. The gate dielectric 240 may have a multilayer structure, such as one layer of silicon oxide and another layer of high-k material. The gate dielectric 240 may be formed using chemical vapor deposition (CVD), physical vapor deposition (PVD), atomic layer deposition (ALD), thermal oxide, other suitable processes, or combinations thereof.

The gate electrode 245 is coupled to metal interconnects 216 and disposed overlying the gate dielectric 240. The gate electrode 245 may include a doped or non-doped polycrystalline silicon (or polysilicon). Alternatively, the gate electrode layer 245 may include a metal, such as Al, Cu, W, Ti, Ta, TiN, TaN, NiSi, CoSi, other suitable conductive materials, or combinations thereof. The gate electrode layer 245 may be formed by CVD, PVD, ALD, plating, and other processes. The gate electrode layer may have a multilayer structure and may be formed in a multiple-step process.

An anti-punch through layer 211 is disposed between the two field insulating layers 208 and 210 below a top surface of the first well 207. The anti-punch through layer 211 through may be a highly doped layer having a conductivity type that is opposite of the doped drain structure 230 above the anti-punch through layer 211 and the same as the first well 207. The anti-punch through layer 211 has a higher dopant concentration than the first well 207 around the anti-punch through layer 211. A drain structure 228 and 230 is formed in the first well N-drift 207 and connected to drain interconnect 214 from above. The drain structure 228 and 230 are located across the field oxide 208 from the gate structure 240 and 245. The drain structure 228 is separated from the drain structure 230 by the field oxide 210. During a high voltage at the drain, the anti-punch through layer 211 prevents breakdown of the transistor through the drain structure 230 and instead routes potential energy through the drain structure 228 which has lower impedance.

The source structure 224 and 226 is disposed in the top surface of an upper portion 209a of the second well P-Body 209, across the gate structure 240 and 245 from the drain structure 228 and 220. In some embodiments, the source has two oppositely doped regions 224 and 226, both formed in the top surface of the upper portion 209a of the second well P-Body 209 and both connected to source interconnect 218 from above. A first region 226 of the source structure and the drain structure 230 may have the first type of conductivity, which is the same as that of the substrate 201. A second region of the source structure and the drain structure 228 may have the second type of conductivity, which is the same as the first well 207. For example in FIG. 2A, the first region 224 and the drain structure 228 include n-type dopants, such as phosphorous or arsenic, and the second region 226 and the drain structure 230 include p-type dopants, such as boron. The source and drain may be formed by a method, such as ion implantation or diffusion. A rapid thermal annealing (RTA) process may be used to anneal the implanted dopants.

Figure 2B:
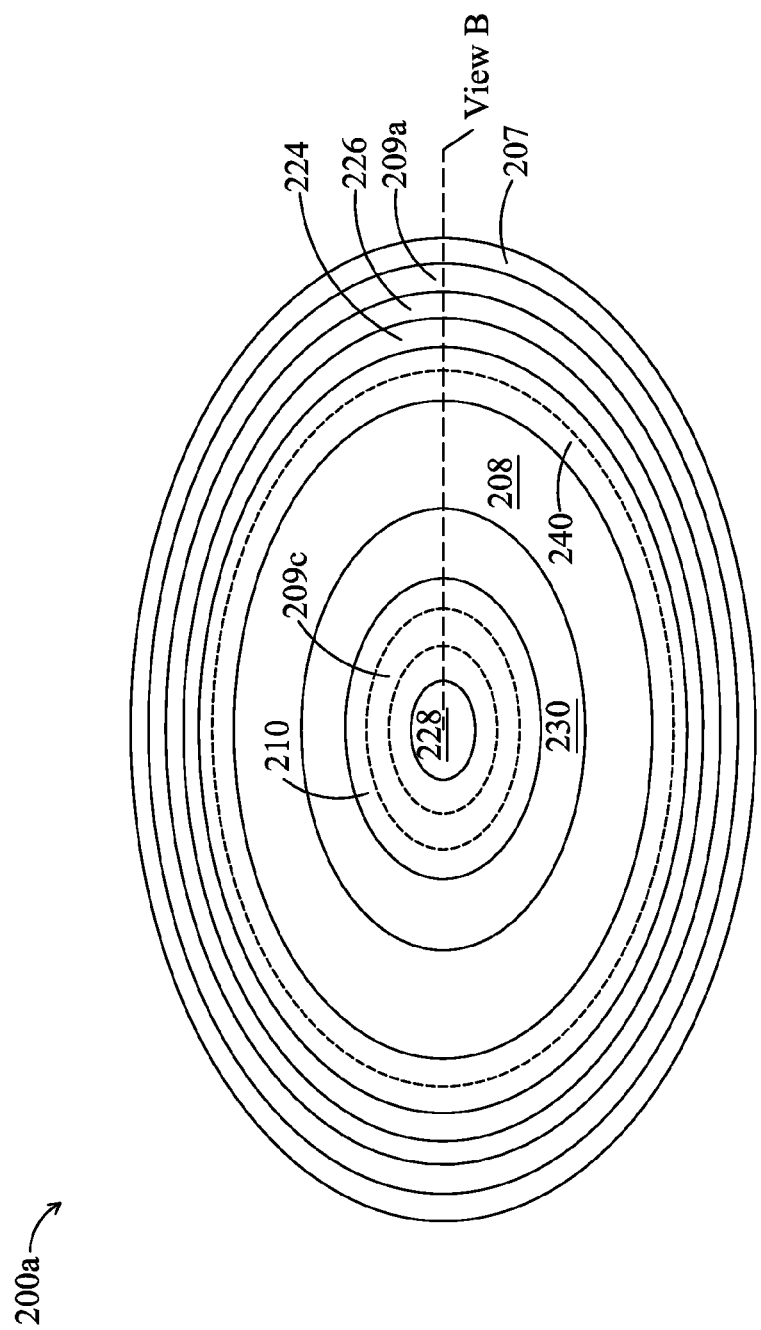
FIGS. 2B and 2C are sectional top views of HV LDMOS transistors according to various embodiments of the present disclosure.
Figure 2C:
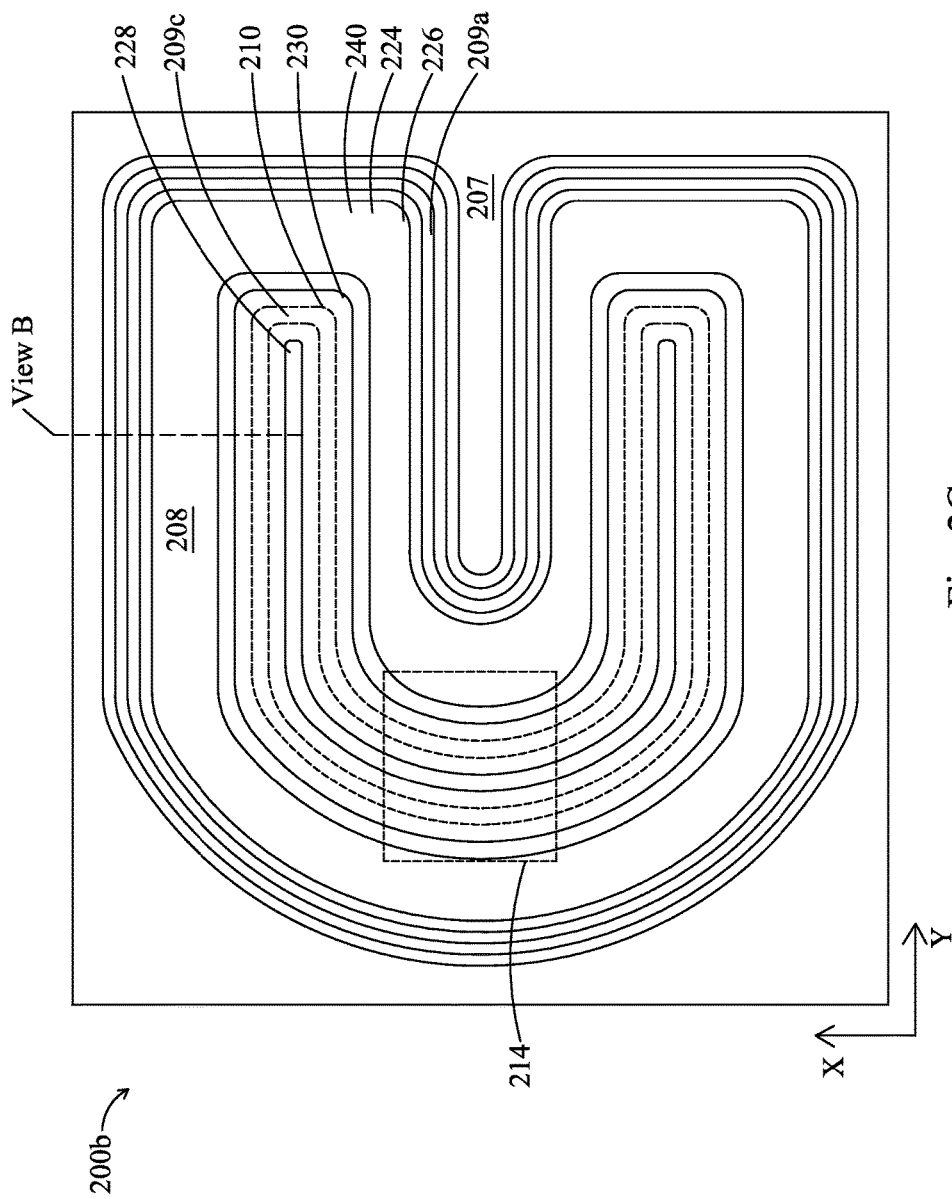

FIGS. 2B and 2C are sectional top views of different embodiments of the cross section of HV LDMOS of FIG. 2A. FIG. 2B shows an embodiment where the HV LDMOS has an elliptical top view, an embodiment of which is a circular top view. As shown in FIG. 2B, a view B cross section is generated with a line drawn from the center of the elliptical top view to an edge. A cross section of View B is the cross section of FIG. 2A. Conversely, FIG. 2A shows a View A line draw across the top surface of the first well 207 across various transistors elements through the field insulating layers. Sectional View A is shown in FIGS. 2B and 2C in different embodiments.

FIGS. 2A and 2B are labeled with same element numbers for the same element for ease of reference. Starting at a center of the elliptical top view, the drain structure portion 228 is the smallest ellipse. Second field oxide 210 is the elliptical donut with solid lines surrounding the drain structure portion 228. Under the second field oxide 210 is the third portion 209c of the second well, with edges of the well shown in dotted lines. Note that only selected transistor elements from FIG. 2A are reflected in FIG. 2B because many elements are under the sectional View A cut. Going radially outward, the next elliptical donut is the drain structure portion 230, and then the first field oxide 208, followed by the gate dielectric layer 240. The dotted line shown in the gate dielectric layer 240 denotes the edge of the first portion 209a of the second well below the gate dielectric layer 240. Adjacent to the gate dielectric 240 is the source structures 224 and 226, followed by a small portion of exposed first portion 209a of the second well. As shown, the first portion 209a of the second well extends from the dotted line below the gate dielectric 240 almost to the outer edge of the elliptical transistor 200a. The outermost elliptical donut shows exposed regions of the first well 207. Note that portions of the first well 207 are disposed below the entire elliptical overview and only a small portion is exposed. The transistor 200a allows a drain pad to be located toward a center of the elliptical structure to maximize breakdown voltage and to reduce substrate leakage. However, packing these structures is difficult on an IC chip, with rectangular sections, without significant non-use of silicon real estate at the corner of the rectangular sections. One variation of the embodiment of FIG. 2B is to form an oval-shaped transistor, such as that of a race track. The oval shape has fairly straight long edges as opposed to the ellipse which continuously curves. The oval shape can be defined to utilize more of the corner areas and reduce the non-use at corners of the rectangular sections. Depending on the size of transistor required, the long edges may be increased or reduced as needed.

According to various embodiments, an HV LDMOS may have a sectional top view of FIG. 2C. As shown in FIG. 2C, View B is defined by a segment from a centerline of drain structure portion 228 to the edge of the transistor 200*b*. A cross section of this View B is the same as that of the View B from FIG. 2B, and both are represented by FIG. 2A. In FIG. 2C, the drain portion 228 is shown as a parabola, a catenary, or a portion of an oval. Another way to describe this shape may be that each element resembles the letter "C" or a sidewise "U". Each successive transistor element from FIG. 2A is repeated around all sides of the drain portion 228. If the View B segment is extended across the entire transistor 200*b*, then most transistor elements would repeat 4 times, except for drain portion 228 (twice) and the exposed portion of the first well 207 (three times). The transistor 200*b* shape may also be described as taking an oval and elongated version of the transistor of FIG. 2B, and bending it half way. It is believed that the transistor 200*b* further maximizes the use of silicon real estate and performance and maintains flexibility in terms of sizing. The HV LDMOS 200*b* can be made larger or smaller by increasing or decreasing the elongated sections. The drain structure portions 228 and 230 are located toward a center of the transistor. A drain pad 214 is shown in dotted lines over portions of the drain structure 228 and 230.

Just as with FIG. 2B, FIGS. 2A and 2C are labeled with the same element numbers for the same element for ease of reference. Starting at a centerline of the drain structure portion 228, second field oxide 210 is a hollow "C" surrounding the drain structure portion 228. Under the second field oxide 210 is the third portion 209*c* of the second well, with edges of the well shown in dotted lines. Note that only selected transistor elements from FIG. 2A are reflected in FIG. 2C because many elements are under the sectional View A cut. Going outward toward the top edge of the transistor 200*b*, the next hollow "C" is the drain structure portion 230, and then the first field oxide 208, followed by the gate dielectric layer 240. The dotted line shown in the gate dielectric layer 240 denotes the edge of the first portion 209*a* of the second well below the gate dielectric layer 240. Adjacent to the gate dielectric 240 is the source structures 224 and 226, followed by a small portion of exposed first portion 209*a* of the second well. As shown, the first portion 209*a* of the second well extends from the dotted line below the gate dielectric 240 almost to the outer edge of the transistor 200*b*. The outermost section is exposed regions of the first well 207, with a small portion in the middle of the transistor 200*b*. Note that portions of the first well 207 are disposed below the entire elliptical overview and only a small portion is exposed.

In some embodiments, the opening of the "C" or "U" may be closed by enjoining the exposed portions of the first portion 209*a* of the second well. In these embodiments, the exposed portions of the first portion 209*a* of the second well surrounds the entire transistor 200*b* with a small portion extending into the middle portion of the transistor 200*b*. The exposed portion of the first well 207 surrounds the entire transistor 200*b* and does not extend into the middle portion of the transistor 200*b*.

In yet another embodiment, the opening of the "C" or "U" may be closed by enjoining source structure portions 226. The source structure portions 226 surround the entire transistor 200*b* with a small portion extending into the middle portion of the transistor 200*b*. The exposed portion of the second well 209*a* and exposed portion of the first well 207 surround the entire transistor 200*b* and do not extend into the middle portion of the transistor 200*b*.

Figure 3:
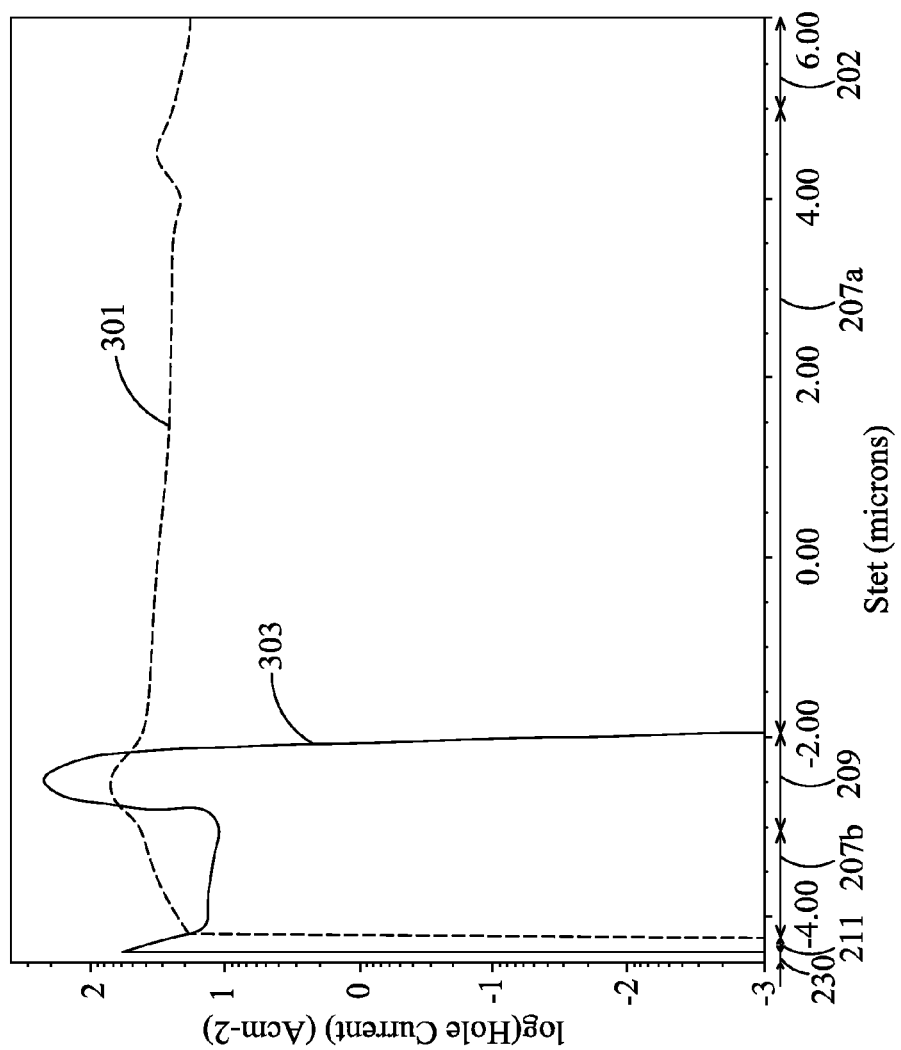
FIG. 3 is a plot of a hole current into a substrate modeled using a comparative HV LDMOS and an HV LDMOS embodiment of the present disclosure.

FIG. 3 is a plot of a hole current into the substrate modeled using a comparative HV LDMOS and the HV LDMOS 200 of the cross section of FIG. 2A. The x-axis shows distance into the substrate from the drain structure portion 230 to the substrate 201 as shown by cut line 235 on FIG. 2A. The y-axis shows a log of the hole current in amps per square centimeters. Dotted line 301 corresponds to a comparative HV LDMOS having a second well having only first and second portions that do not extend past the first field oxide and cross the first well portion below the drain structure. Solid line 303 corresponds to the HV LDMOS 200 having a second well having a U-shape as described herein.

At or around a top surface of the drain structure 230, neither line depicts significant hole current and both lines quickly increases to a high volume within the drain structure 230. For line 301, the hole current increases slowly throughout the first well 207 and levels off at a relatively high value of more than 1 log amps per centimeter squared. For line 303, the hole current quickly reduces at about the anti-punch through layer 211, holds relatively steady across the first well portion surround by the U-shape second well and increases inside the second portion 209*b* of the second well. However, the hole current decreases rapidly at the substrate side edge of the second well to a negligible current past the second well. FIG. 3 shows that the HV LDMOS 200 effectively directs the hole current across the transistor without substrate leakage.

Figure 4:
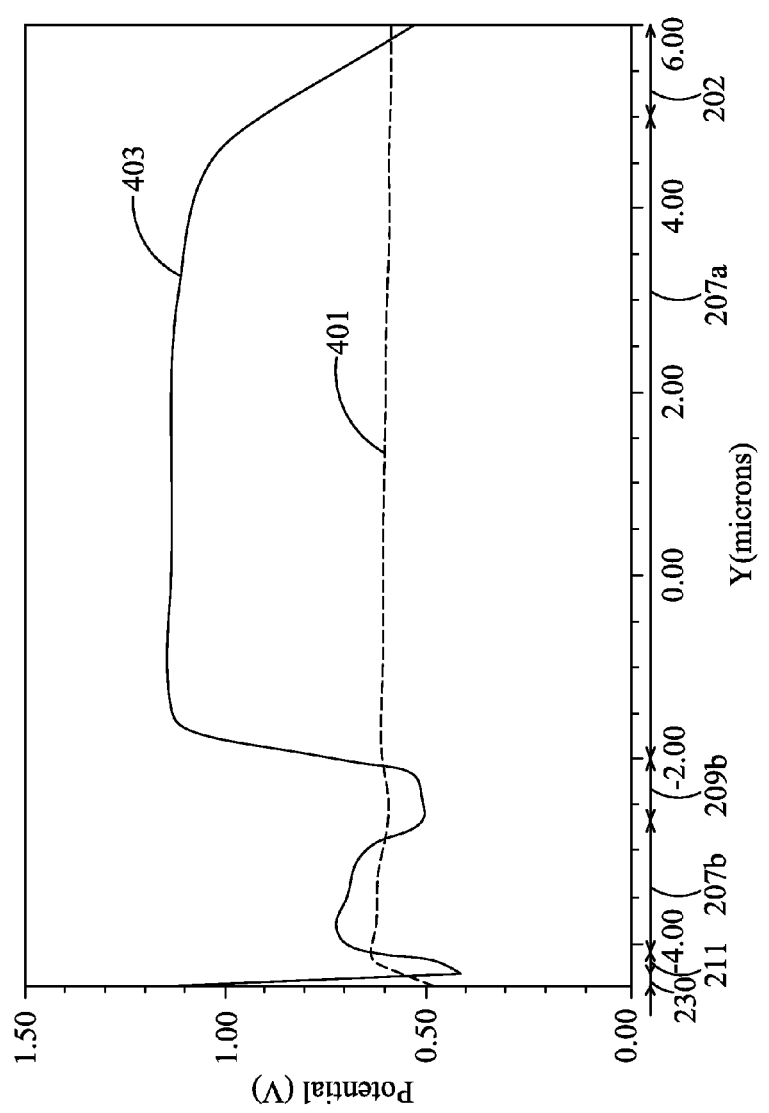
FIG. 4 is a plot of model electric potential across the same cut line during transistor operation for the comparative HV LDMOS and an HV LDMOS embodiment of the present disclosure.

FIG. 4 is a plot of a model electric potential across the cut line 235 during transistor operation for the comparative HV LDMOS and the HV LDMOS 200 of FIG. 2A. The x-axis shows distance into the substrate from the drain structure portion 230 to the substrate 201 as shown by cut line 235 on FIG. 2A. The y-axis shows the electric potential in volts. For the comparative HV LDMOS as shown by dotted line 401, the potential increases slightly at the drain structure and quickly levels off at a relatively constant potential. For the HV LDMOS 200 as shown by solid line 403, the potential is low in the anti-punch through layer (layer 211 of FIG. 2A), is higher in the portion of the first well 207*b* surrounded by the U-shape second well, and is low again in the second portion 209*b* of the second well (bottom of the U-shape). The potential 403 increases into the first well under the second well and the substrate. The dip in potential around the second portion 209*b* of the second well is a low potential conduit for the hole current. Below the second well, the potential increases by as much as 0.7 volts which biases the holes current to stay within the conduit. According to FIG. 3, little or no hole current overcomes this potential barrier into the substrate.

Figure 5A:
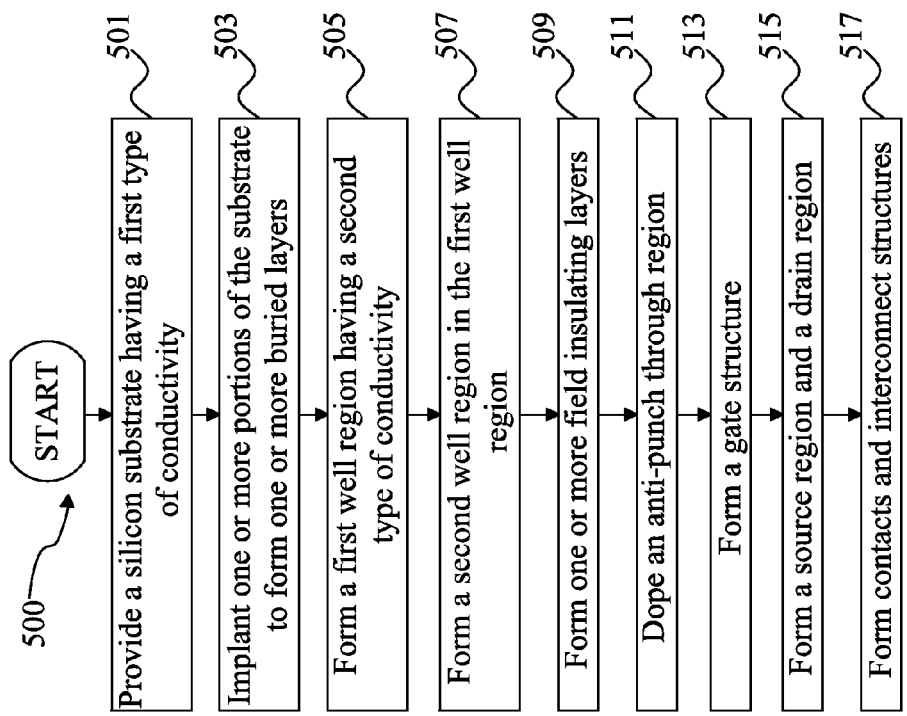
FIGS. 5A and 5B are flow charts of a method for fabricating a HV LDMOS device according to various aspects of the present disclosure.
Figure 5B:
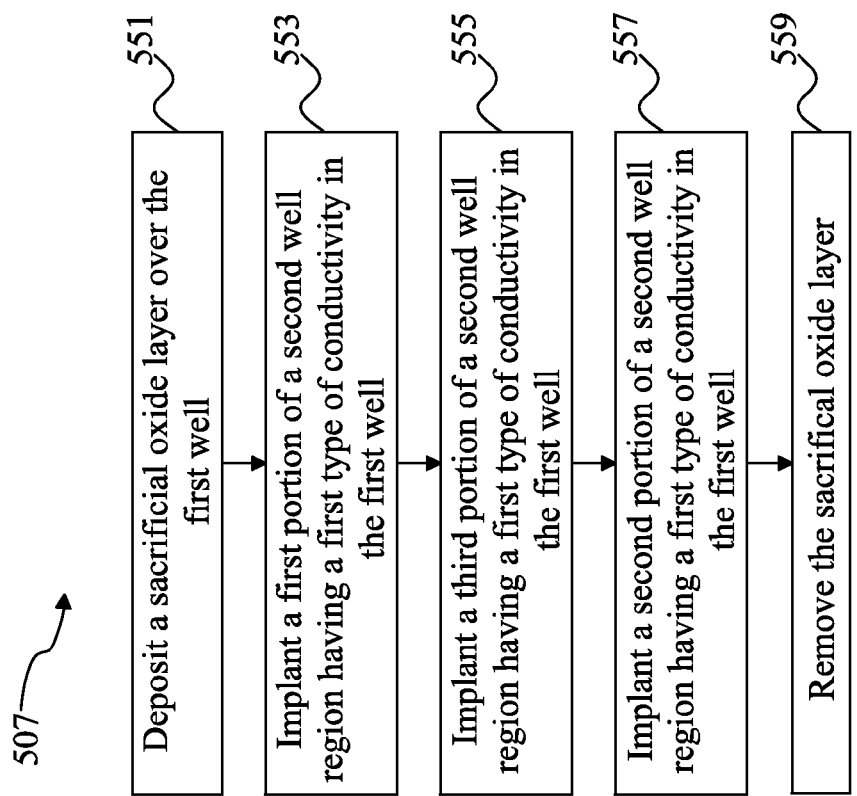

FIGS. 5A and 5B are flowcharts of a method 500 for fabricating a high voltage laterally diffused MOS semiconductor device, according to various aspects of the present disclosure. It should be noted that the method 500 may be implemented in a complementary metal oxide semiconductor (CMOS) technology process flow. Accordingly, it is understood that additional processes may be provided before, during, and after the method 500, and some processes may only be briefly described herein. FIG. 5B shows a portion of the method 500 according some embodiments of the present disclosure.

Figure 6A:
FIG. 6A to 6I are cross sections of a HV LDMOS device embodiment of the present disclosure in various stages of manufacturing according to some embodiments of the present disclosure.
Figure 6B:
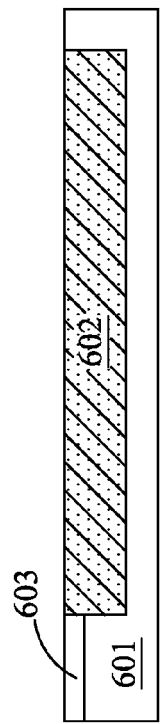

The method 500 begins with block 501 in which a semiconductor substrate is provided. The substrate has a first type of conductivity. For example, as shown in FIG. 6A, the substrate may be p-type as the substrate 601. In various examples, the substrate 601 is a lightly doped silicon wafer. The method 500 continues at block 503 in which n-type dopant is implanted into the lightly doped semiconductor substrate. FIG. 6B shows a substrate 601 having buried layers 602 and 603 below a top surface of the substrate 601. The substrate 601 is patterned first to protect areas not intended to be exposed to implantation. Then n-type dopant, for example, phosphorus, is implanted into the substrate. A peak concentration may be located at about 5 microns into the substrate 601. Buried layer 603 receives a higher dose than buried layer 602. For example, the buried layer 603 may have a peak dopant concentration at about 1E16, while the buried layer 602 may have a peak dopant concentration about half that of the buried layer 603. The top surface remains flat for subsequent epitaxial processes. After implanting, the patterning is removed to result in the workpiece of FIG. 6B. In some embodiments, the workpiece is annealed at a high temperature of 800 degrees Celsius to complete the formation of the buried layers.

Figure 6C:
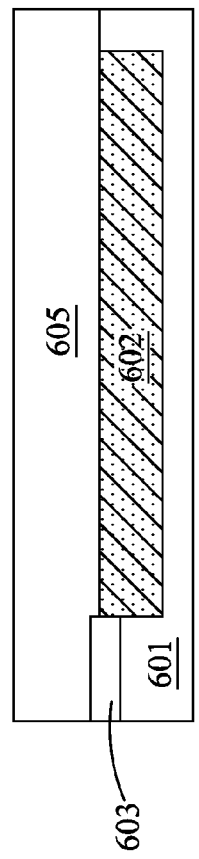

In operation 505 of FIG. 5A, a first well region is formed having a second type of conductivity, which is different from the first type of conductivity of the substrate. As shown in FIG. 6C, for example, the first well 605 may be an n-well, such as the n-well (N-Drift) formed over the p-substrate 601. The first well 605 may be epitaxially grown over the substrate using epitaxial processes known in the art. For example, the first well 605 may be about 4 micrometers thick, or between about 2 and about 5 micrometers thick. The epitaxial process for forming the first well 605 have an anneal effect to diffuse the dopant from buried layer 603 into the newly formed first well 605 such that the buried layer 603 becomes larger as shown in FIG. 6C.

Figure 6D:
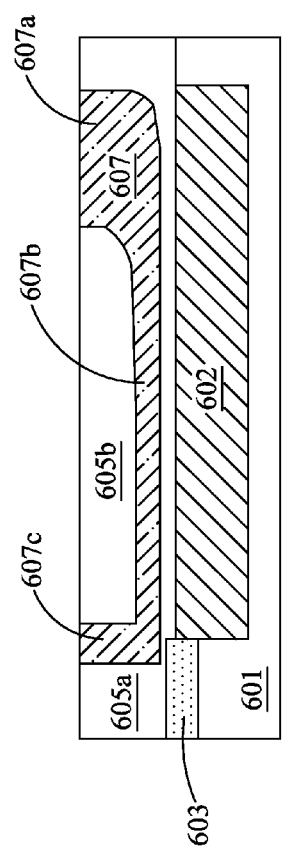

The method 500 continues with block 507 in which a second well region is formed in the first well region. FIG. 5B shows the operations of block 507 in more detail, and FIG. 6D shows the second well region 607 in the first well region 605. In operation 551, a sacrificial oxide is deposited over the first well 605. The sacrificial oxide is subsequently removed and serves to protect the top surface from implantation damage. In operation 553, a first portion 607a of the second well 607 is formed by implanting a dopant of a first type of conductivity in the first well 605. In operation 555, a third portion 607c of the second well 607 is formed by implanting a dopant of a first type of conductivity in the first well 605. These operations 553 and 555 may require several implanting steps to disperse the dopant into the workpiece to a sufficient depth, for example, at about 2 to 4 microns deep. In operation 557, a second portion 607b of the second well 607 is formed by implanting a dopant of a first type of conductivity in the first well 605. The second portion 607b extends laterally from the first portion 607a to the third portion 607c below the top surface of the first well 605. The sacrificial oxide is removed in operation 559 by etching. Either operations 553, 555, and 557 may be formed first using a first pattern, then the other ones may be formed using different patterns. The implantation may use substantially the same dopant concentrations at different implantation energy levels to achieve varying depths, or different concentrations and different energies.

In some embodiments, a first portion 607a and a third portion 607c of a second well 607 is formed in one operation in the first well 605, and a second portion 607b is formed in another operation. In other words, operations 553 and 555 are performed in the same process tool in the same operation. The first portion 607a of the second well 607 starts from the top surface of the first well 605 and extends down in the first well 605. A third portion 607c of the second well 607 also starts from the top surface of the first well 605, but at a different location from the first portion 607a. The first portion 607a and third portion 607c may be formed in the same operation by implanting a p-type dopant, for example, boron, into the first well 605 using one pattern having two openings. Then in a second operation using a different pattern, a second portion 607b of the second well 607 is formed in the first well 605. The second well have the first type of conductivity same as that of the substrate 601. The first and third portions and the second portion of the second well are formed by implanting a p-type dopant using different patterns at different energies. In order to penetrate the first well 605 to a sufficient depth below the top surface, a higher energy is used for the second portion 607b. As shown in FIG. 6D, the resulting second well has a U-shape, but other variations are possible. For example, the second well may be an inverted II.

Figure 6E:
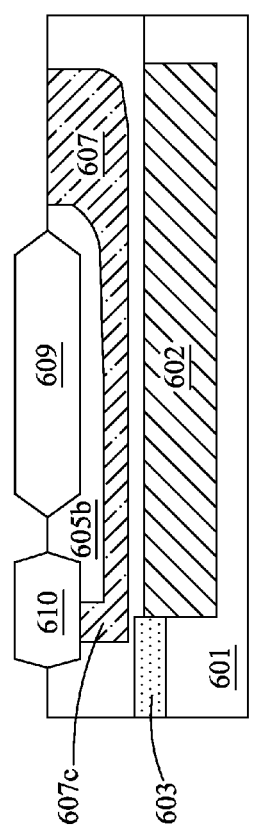

The method 500 continues with block 509 in which one or more insulating layers, also referred to as a field oxide, is formed on the workpiece. The insulating layers may include a dielectric, such as silicon oxide, nitride, or other suitable insulating materials. FIG. 6E shows a first field oxide 609 formed over and in the first well 605b region that is surrounded by second well 607 and a second field oxide 610 formed over the third portion 607c of the second well. The field oxides 609 and 610 may be formed by a thermal oxide process. The workpiece is patterned to protect regions where the field oxide is undesirable and subjected to a high temperature, for example, about 500 degrees Celsius, in the presence of oxygen and optionally water. When used, presence of water speed the oxide formation process.

Figure 6F:
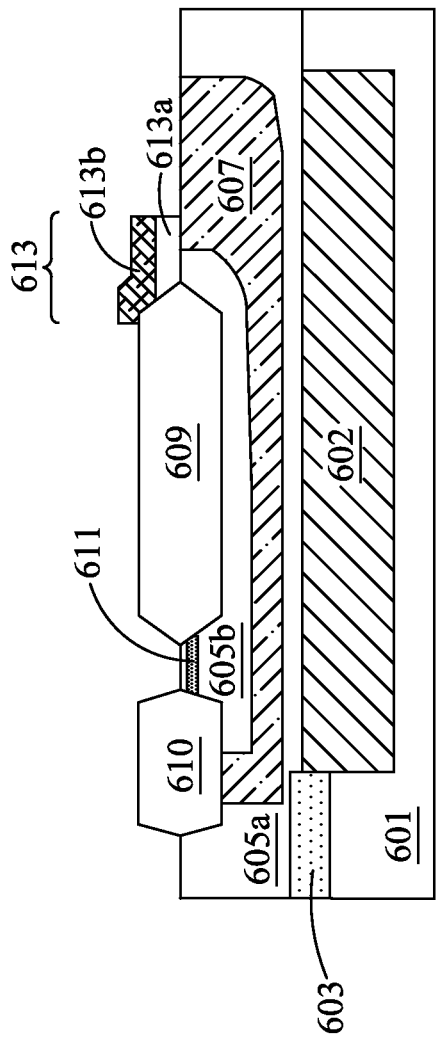

In the next block 511 of method 500, an anti-punch through region, also referred to as anti-punch through layer, is formed by doping or implanting a region of the first well between the field oxides 609 and 610. FIG. 6F shows the anti-punch through layer 611 below a top surface of the first well portion 605b that is surrounded by the U-shaped second well 607. The anti-punch through layer 611 may be formed by implanting phosphorus or phosphorus-containing dopants at a medium to high energy.

Referring back to FIG. 5A, in operation 513, a gate structure is built over the workpiece. As shown in FIG. 6F, the gate structure 613 has a lower dielectric layer 613a and an upper electrode layer 613b. The gate structure 613 may overlie three areas: a first part of the gate structure 613 overlies the edge of the insulating layer 609, a second part of the gate structure overlies the top surface of the first well 605, and the third part of the gate structure overlies the first portion of the second well 607. The precise overlay of the gate structure to the three areas is achieved by a process including photolithography patterning and etching. One exemplary method for patterning the gate dielectric and electrode layers over the three areas is described below. A layer of photoresist is formed on the polysilicon electrode layer by a suitable process, such as spin-on coating, and then patterned to form a patterned photoresist feature by a proper lithography patterning method. The pattern of the photoresist can then be transferred by a dry etching process to the underlying polysilicon layer and the gate dielectric layer to form gate electrodes and gate dielectric, in a plurality of processing steps and various proper sequences. The precise overlay of the gate structure to the field oxide, the first well, and the second well is controlled by the lithographic alignment procedure. The photoresist layer is stripped thereafter. In another embodiment, only the gate electrode layer is patterned. In another embodiment, a hard mask layer may be formed on the polysilicon layer. The patterned photoresist layer is formed on the hard mask layer. The pattern of the photoresist layer is transferred to the hard mask layer and then transferred to the polysilicon layer to form the gate electrode. The hard mask layer may include silicon nitride, silicon oxynitride, silicon carbide, and/or other suitable dielectric materials, and may be formed using a method such as CVD or PVD.

Figure 6G:
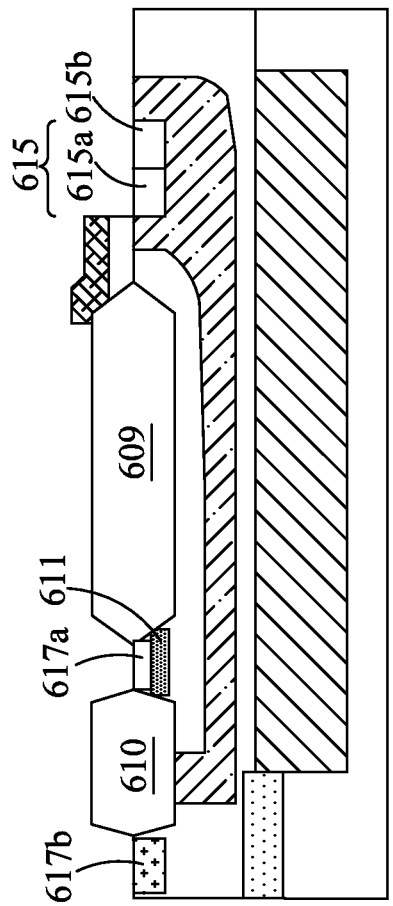

Referring back to FIG. 5A, the method 500 continues with block 515, in which a source region and a drain region are formed. As shown in FIG. 6G, the source region 615 includes two regions 615a and 615 b. A first source region 615a may have the first type of conductivity; a second source region 615b, formed next to the first source region 615a, may have the second type of conductivity. For example, the first source region 615a is p-type, and the second source region 615b is n-type or vice versa. The drain region 617 includes two regions 617a and 617 b. A first drain region 617a may have the first type of conductivity; a second drain region 617b, formed next to the first drain region 617a across the second field oxide 610 and the third portion 607c of the second well, may have the second type of conductivity. For example, the first drain region 617a is p-type, and the second drain region 617b is n-type or vice versa. The first drain region 617a is formed over the anti-punch through layer 611 that has a different type of conductivity than the anti-punch through layer 611.

The first and second source and drain regions are formed by implanting n-type or p-type or both types of dopants in each of the regions. Portions may be implanted at the same time. In one example, regions 617a and 615b are implanted at the same time; and regions 617b and 615a are implanted at the same time. In another example, all of the regions are implanted using one type of dopant and only two regions are implanted using another type of dopant. In still other examples, the regions are implanted at different times.

Figure 6H:
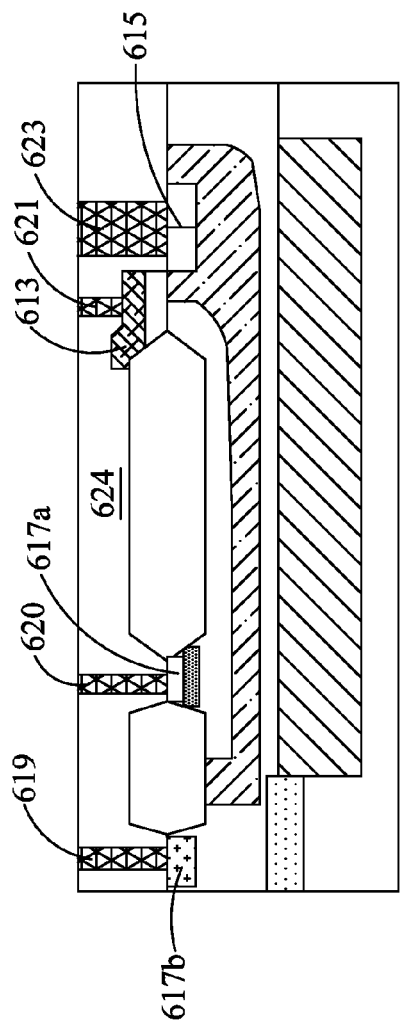
Figure 6I:
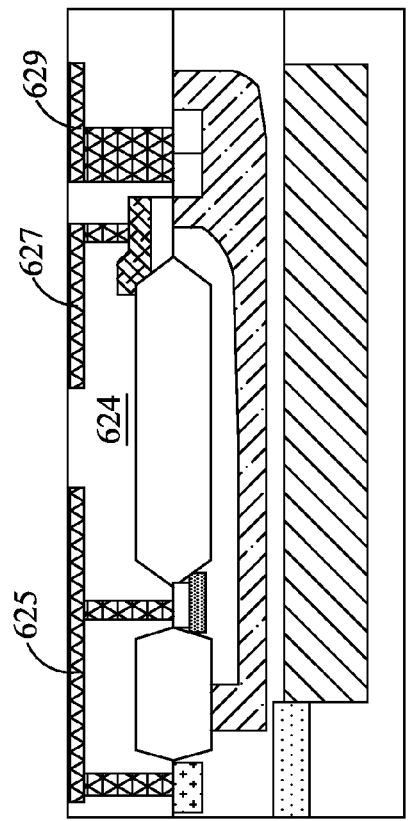

Referring back to FIG. 5A, contacts and interconnect structures are formed over the transistor in block 517. As shown in FIG. 6H, contact structures 619, 620, 621, and 623 are formed over various features of the transistor. Contacts 619 and 620 each connects to one of the drain regions 617a and 617b. Contact 621 connects to the gate 613. Contact 623 connects to the source regions 615a and 615b singly or together. An interlayer dielectric (ILD) 624 fills the space between the various contacts. After the contacts are formed, a first layer of interconnects is complete after interconnects 625, 627, and 629 are formed.

The interconnect structure and contacts are formed of conductive materials, such as aluminum, aluminum/silicon/ copper alloy, titanium, titanium nitride, tungsten, polysilicon, metal silicide, or combinations thereof, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical connection (via and contact) and horizontal connection (conductive line). Alternatively, a copper multi-layer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

The ILD 624 includes silicon oxide. Alternatively or additionally, the ILD 624 includes a material having a low dielectric constant, such as a dielectric constant less than about 3.5. In one embodiment, the dielectric layer includes silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The dielectric layer may be formed by a technique including spin-on, CVD, or other suitable processes.

The contacts and interconnects are usually metal formed in an integrated process such as a damascene process. In a damascene process, a metal such as copper is used as conductive material for interconnection. Another metal or metal alloy may be additionally or alternatively used for various conductive features. Accordingly, silicon oxide, fluorinated silica glass, or low dielectric constant (k) materials can be used for the ILD 624. During the damascene process, a trench is formed in a dielectric layer, and copper is filled in the trench. Chemical mechanical polishing (CMP) technique is implemented afterward to etch back and planarize the substrate surface.

Among various embodiments, the present structure provides an enhanced performing high voltage device, configured as a lateral diffused MOS (HV LDMOS) formed in a tri-well structure (a small n-well in an extended p-type well inside an n-type well) within the substrate with an anti-punch through layer and a buried layer below the n-type well, which reduces substrate leakage current to almost zero. The drain region is separated into two regions, one within the small n-well and one contacting the outer n-type well such that the substrate is available for electric potential lines during when a high drain voltage is applied.

One aspect of this description relates to a method for fabricating a high voltage semiconductor transistor. The method includes forming a buried layer having a second type of conductivity in a portion of a semiconductor substrate, wherein the semiconductor substrate has a first type of conductivity. The method further includes epitaxially growing a doped first well region over the substrate, the first well region having the second type of conductivity different from the first type of conductivity. The method further includes doping a first portion and a third portion of a second well region having a first type of conductivity in the first well region, the first portion and the third portion occupying a region starting from the top surface of the first well region and extending down in the first well region. The method further includes doping a second portion of the second well region in the first well region, the second portion extending laterally from the first portion to the third portion under the top surface of the first well region, wherein the first portion, the second portion, and the third portion of the second well form a U-shaped second well region. The method further includes thermally growing a first insulating layer in and over a first well portion within the U-shape of the second well region and a second insulating layer on the substrate over the third portion of the second well region. The method further includes doping an anti-punch through region in the first well region within the U-shape of the second well region. The method further includes forming a gate structure on the substrate, the gate structure having a first part overlying the first insulating layer, a second part overlying the first well region, and a third part overlying the first portion of the second well region. The method further includes forming a source region in the first portion of the second well region on an opposite side of the gate structure from the first insulating layer. The method further includes forming a drain region in the first well region, wherein a first portion of the drain region is formed over the anti-punch through region and a second portion of the drain region is disposed outside of the second well region.

Another aspect of this description relates to a method of making a high voltage semiconductor transistor. The method includes growing a first well region over a semiconductor substrate, wherein the first well region has a first type of conductivity. The method further includes implanting a second well region in the first well region, the second well region having a second type of conductivity opposite the first type of conductivity. Implanting the second well region includes implanting a first portion extending parallel to a top surface of the first well region, implanting a second portion extending from a first end of the first portion to the top surface of the first well region, and implanting a third portion extending from a second end of the first portion, opposite the first end, to the top surface of the first well region, wherein the second well defines an enclosed portion of the first well region surrounded by the second well region. The method further includes forming an insulating structure over the enclosed portion and separated from the second well region. The method further includes forming a gate structure near the insulating structure over the enclosed portion and partially over the first portion of the second well region. The method further includes forming a drain region in the first well region across the insulating structure from the gate structure, wherein the drain region comprises a first drain portion in the enclosed portion and a second drain portion outside the enclosed portion.

Still another aspect of this description relates to a method of making a high voltage semiconductor transistor. The method includes implanting an n-type buried layer in a lightly-doped p-type substrate, wherein the n-type buried layer includes a first portion and a second portion. The method further includes growing an n-type first well region over the substrate, the first well region having a lower dopant concentration than the buried layer, wherein the second portion of the buried layer is partially in the first well region. The method further includes implanting a p-type second well region in the first well region, wherein the second well region has a U-shape in a cross section taken in a direction perpendicular to a top surface of the lightly doped substrate, and both ends of the U-shape extend to a top surface of the first well region and define an enclosed portion of the first well region. The method further includes forming a first insulating structure in the enclosed portion of the first well region. The method further includes forming a second insulating structure over a first end of the U-shape of the second well region. The method further includes forming a gate structure over the first well region and over a second end of the U-shape of the second well region, wherein the gate structure overlays the first insulating structure. The method further includes forming a drain region in the first well region across the first insulating structure from the gate structure. Forming the drain region includes implanting a first drain portion between the first insulating structure and the second insulating structure, and implanting a second drain portion across the second insulating structure from the first drain portion, wherein the second drain portion is over the portion of the buried layer in the first well region. The method further includes implanting an anti-punch through region below the first drain portion.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A high voltage semiconductor transistor, comprising:
   a semiconductor substrate having a first type of conductivity; a first well region having a second type of conductivity and formed over the semiconductor substrate;
   a second well region in the first well region and having the first type of conductivity; a first insulating structure over the first well region;
   a gate structure adjacent the first insulating structure and between a source region and a drain region;
   the drain region comprising a first drain portion between the first insulating structure and a second insulating structure and a second drain portion across the second insulating structure from the first drain portion, wherein the first drain portion has the first type of conductivity and the second drain portion has the second type of conductivity; and
   wherein the first type of conductivity is different from the second type of conductivity; and
   the source region disposed on a side of the gate structure opposite from the drain region.

2. The transistor of claim 1, wherein the second well region has a U-shape in a cross section and extends from an interface with the source region to an interface with the second insulating structure, and the cross section is taken in a direction perpendicular to a top surface of the semiconductor substrate.

3. The transistor of claim 1, wherein the gate structure includes a gate dielectric layer and a gate electrode layer, wherein the gate electrode layer is disposed on a surface of the first insulating structure.

4. The transistor of claim 1, wherein the first type of conductivity is p-type and the second type of conductivity is n-type.

5. The transistor of claim 1, wherein the source region has a first source portion and a second source portion, the second source portion abutting the first source portion.

6. The transistor of claim 5, wherein the first source portion has the first type of conductivity and the second source portion has the second type of conductivity, and wherein the first drain portion has the first type of conductivity and the second second type of conductivity.

7. The transistor of claim 1, further comprising:
   a buried layer on the semiconductor substrate under the first well region, the buried layer having the second type of conductivity.

8. The transistor of claim 7, wherein the buried layer has a first portion with a first dopant concentration and a second portion with a second dopant concentration, the first dopant concentration being greater than the second dopant concentration.

9. The transistor of claim 8, wherein the first portion of the buried layer underlies the second drain portion, and wherein the second portion of the buried layer underlies the first insulating structure and the source region.

10. A transistor, comprising:
    a gate structure having a gate dielectric layer and an overlying gate electrode layer;
    a source structure disposed on a first side of the gate structure;

a drain structure disposed on a second side of the gate structure opposite the first side;

an insulating layer disposed between the drain structure and the gate structure;

a first buried layer under the drain structure wherein the first buried layer does not extend under the source structure or the gate structure, wherein the first buried layer has a dopant of a first type of conductivity at a first concentration; and a second buried layer under the gate structure and the source structure, wherein the second buried layer has a dopant of the first type of conductivity at a second concentration, the second concentration less than the first concentration.

11. The transistor of claim 10, further comprising: a n-drift well over the first buried layer and the second buried layer; and a p-body well over the first buried layer and the second buried layer.

12. The transistor of claim 10, wherein the drain structure includes a first drain region and a second drain region, the first and second drain regions separated by a first distance.

13. The transistor of claim 12, wherein the first buried layer underlies the first drain region and not the second drain region.

14. The transistor of claim 12, wherein another insulating layer is disposed in the first distance.

15. The transistor of claim 12, further comprising: an anti-punch through layer under the second drain region of the drain structure.

16. A transistor, comprising:
a semiconductor substrate having a first type of conductivity;

a first well region having a second type of conductivity and formed over the semiconductor substrate;

a second well region in the first well region and having the first type of conductivity, the second well region having a U-shape in a cross section and extending from a source region to a first insulating structure disposed on the semiconductor substrate adjacent a drain region, and the cross section is taken in a direction perpendicular to a top surface of the semiconductor substrate;

a second insulating structure over the first well region and at least a portion of the U-shape of the second well region and not contacting the second well region;

a gate structure between the source region and the drain region;

the drain region across the second insulating structure from the gate structure, the drain region comprising a first drain portion between the first insulating structure and the second insulating structure and a second drain portion across the first insulating structure from the first drain portion; and the source region disposed on a side of the gate structure opposite from the drain region.

17. The transistor of claim 16, wherein the gate structure and the drain region have one of a conic section shape and a catenary shape in a top view.

18. The transistor of claim 16, wherein the first drain portion and the second drain portion differ in dopant conductivity type.

19. The transistor of claim 16, wherein an anti-punch through layer is disposed under the first drain portion.

20. The transistor of claim 16, wherein the gate structure is disposed partially on the first insulating structure.

* * * * *